United States Patent
Sumita

(10) Patent No.: US 7,405,611 B2
(45) Date of Patent: Jul. 29, 2008

(54) SEMICONDUCTOR INTEGRATED CIRCUIT DEVICE

(75) Inventor: Masaya Sumita, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/706,955

(22) Filed: Feb. 16, 2007

(65) Prior Publication Data

US 2007/0146049 A1    Jun. 28, 2007

Related U.S. Application Data

(63) Continuation of application No. 11/002,703, filed on Dec. 3, 2004, now Pat. No. 7,196,571.

(30) Foreign Application Priority Data

Jan. 6, 2004    (JP) ............... P. 2004-001259

(51) Int. Cl.
*H03K 3/01* (2006.01)
(52) U.S. Cl. ..................... 327/534; 327/537
(58) Field of Classification Search ............... None
See application file for complete search history.

(56) References Cited

U.S. PATENT DOCUMENTS

| | | | |
|---|---|---|---|
| 5,680,359 A | 10/1997 | Jeong | |
| 6,075,404 A * | 6/2000 | Shindoh et al. | 327/537 |
| 6,166,577 A | 12/2000 | Mizuno et al. | |
| 6,380,798 B1 * | 4/2002 | Mizuno et al. | 327/534 |
| 6,469,568 B2 * | 10/2002 | Toyoyama et al. | 327/534 |
| 6,867,637 B2 * | 3/2005 | Miyazaki et al. | 327/534 |
| 6,946,865 B2 * | 9/2005 | Mizuno et al. | 324/765 |
| 7,002,397 B2 * | 2/2006 | Kubo et al. | 327/534 |
| 2001/0007537 A1 | 7/2001 | Agawa et al. | |
| 2002/0044007 A1 * | 4/2002 | Mizuno et al. | 327/534 |
| 2002/0057545 A1 | 5/2002 | Maehara et al. | |
| 2002/0075086 A1 | 6/2002 | Kuroda | |
| 2002/0180513 A1 * | 12/2002 | Toyoyama et al. | 327/536 |
| 2005/0093611 A1 | 5/2005 | Fujita et al. | |
| 2005/0116765 A1 | 6/2005 | Sakiyama et al. | |
| 2006/0091936 A1 | 5/2006 | Ikenaga et al. | |

OTHER PUBLICATIONS

Keshavarzi, A., et al. "Effectiveness of Reverse Body Bias for Leakage Control In Scaled Dual Vt CMOS ICs." ISLPED'01 pp. 207-212.

* cited by examiner

*Primary Examiner*—Cassandra Cox
(74) *Attorney, Agent, or Firm*—McDermott Will & Emery LLP

(57) ABSTRACT

To save power consumption in a semiconductor integrated circuit 2A increased due to a leak current caused by a variation in a manufacturing process, temperature, and a power supply voltage.

A semiconductor integrated circuit 2A, a leak current detection circuit 3, a comparison operation circuit 4 and an applied voltage output circuit 5A are provided. The semiconductor integrated circuit 2A has a circuit body 21 including a plurality of functional MOSFETs for performing predetermined functional operations, and a monitor circuit 22A including a plurality of monitor NMOSFETs 23 for monitoring properties of the functional MOSFETs. The leak current detection circuit 3 detects leak data corresponding to leak currents from the monitor NMOSFETs 23, and outputs the detected leak data. The comparison operation circuit 4 extracts, from a plurality of pieces of leak data, one piece of leak data minimizing a leak current in the circuit body 21, and outputs the extracted leak data as applied voltage data. The applied voltage output circuit 5A sets and outputs a source-drain voltage to be applied to the functional MOSFETs based on the applied voltage data.

5 Claims, 15 Drawing Sheets

LOWER LIMIT VOLTAGE

FIG. 14 (A)

|  | INCREMENT/ DECREMENT BIT(PE) |
|---|---|
| INCREMENT | 1 |
| DECREMENT | 0 |

FIG. 14 (B)

|  | MAINTENANCE (BIT) |
|---|---|
| MAINTAIN | 1 |
| DO NOT MAINTAIN | 0 |

FIG. 14 (C)

|  | GEAR BIT |
|---|---|
| Vbs step 0.1V | 0 |
| Vbs step 0.01V | 1 |

FIG. 15

STATE TRANSITION TABLE

| PE | | | |
|---|---|---|---|
| 1 | (A) P<I => PE=0 | (B) P>I => PE=1 | (C) P=I => M=1 |
| 0 | (D) P>I => PE=0 | (E) P<I => PE=1 | (F) P=I => M=1 |

SEMICONDUCTOR INTEGRATED CIRCUIT DEVICE

RELATED APPLICATIONS

This application is a continuation of application Ser. No. 11/002,703, filed on Dec. 3, 2004, now U.S. Pat. No. 7,196,571 which claims priority of Japanese Application No. 2004-001259, filed Jan. 6, 2004, the contents of which are hereby incorporated by reference.

BACKGROUND OF THE INVENTION

1. Field of the Invention

The present invention relates to a semiconductor integrated circuit device intended to suppress a leak current from insulated gate field effect transistors so as to save the power consumption.

2. Description of the Related Art

In a semiconductor integrated circuit, a large number of insulated gate field effect transistors (hereinafter abbreviated to "MOSFETs") are provided. Further, the channel length is shortened by a micro-fabrication process, and the gate oxide film thickness is reduced, so as to increase the integration or improve the operating speed. However, a threshold is lowered, or the ratio of a leak current to the power consumption increases. Thus, a solution to those problems is requested.

It is a well-known fact that the threshold or the leak current can be controlled to some extent by adjusting a source-substrate voltage or a source-drain voltage. Researches in recent years have suggested that when such a voltage is made not higher than a certain voltage, the leak current increases unexpectedly due to GIDL (Gate Induced Drain Leakage), BTBT (Band To Band Tunneling) or the like (see A. Keshavasrzi and seven others, "Effectiveness of Reverse Body Bias for Leakage Control in Scaled Dual Vt CMOS ICs", ISLP ED'01 pp. 207-211).

Therefore, a technique in which a fixed limit value is set for the source-substrate voltage and the voltage is prevented from exceeding the limit value so as to suppress a leak current has been proposed (see Japanese Patent Application No. 2003-358891).

However, with the advance of the micro-fabrication process, it has been difficult to suppress a variation in process with sufficient accuracy. Thus, as in Patent Document 1, due to a variation in the source-substrate voltage perfect for suppressing the leak current, the leak current may increase unexpectedly in the configuration where a fixed limit value is provided to set the source-substrate voltage. Further, any leak current has dependency on temperature. Accordingly, when the source-substrate voltage or the source-drain voltage is set independently of the device temperature, there is a problem that the leak current cannot be suppressed satisfactorily.

There is a problem that the source-substrate voltage or the source-drain voltage perfect for reducing the current leakage depends not only on such a variation in process but also on a temperature condition or a power supply voltage.

SUMMARY OF THE INVENTION

It is therefore an object of the invention to provide a semiconductor integrated circuit device in which even when there is a variation in process, a leak current can be suppressed without increasing the leak current due to a GIDL phenomenon or a BTBT phenomenon, and the leak current can be further suppressed in accordance with the device temperature so as to save the power consumption.

A semiconductor integrated circuit device according to the invention includes: a semiconductor integrated circuit including a circuit body having a plurality of functional MOSFETs for performing predetermined functional operations, and a monitor circuit including a plurality of monitor MOSFETs for monitoring properties of the functional MOSFETs; a leak current detection circuit for detecting a leak current from the monitor MOSFETs and outputting the detected leak current as leak data; a comparison operation circuit for extracting, from a plurality of pieces of the leak data, one piece of leak data minimizing a leak current from the circuit body, and outputting the extracted leak data as applied voltage data; and an applied voltage output circuit for setting a voltage to be applied to the functional MOSFETs based on the applied voltage data, and outputting the set voltage.

With the aforementioned configuration, applied voltage data minimizing the leak current is extracted from the leak data, and the applied voltage is set and applied to the circuit body based on the extracted applied voltage data. Accordingly, the power consumption can be saved even when there is a variation in process, and while preventing the leak current from increasing due to a GIDL phenomenon or a BTBT phenomenon.

The semiconductor integrated circuit device according to the invention may be adapted so that the applied voltage set and outputted by the applied voltage output circuit is a source/drain voltage.

With the aforementioned configuration, a source-rain voltage minimizing the leak current is extracted and set from the leak data, and applied to the circuit body. Accordingly, the power consumption can be saved even when there is a variation in process, and while preventing the leak current from increasing due to a GIDL phenomenon or a BTBT phenomenon.

The semiconductor integrated circuit device according to the invention may be adapted so that the applied voltage set and outputted by the applied voltage output circuit is a source-substrate voltage.

With the aforementioned configuration, a source-substrate voltage minimizing the leak current is extracted and set from the leak data, and applied to the circuit body. Accordingly, the power consumption can be saved while preventing the leak current from increasing due to a GIDL phenomenon or a BTBT phenomenon.

The semiconductor integrated circuit device according to the invention may be adapted so that the comparison operation circuit includes: a data holding circuit for sampling the leak data and holding the leak data as a previous value; and a comparison circuit for sampling the leak data as an immediate value while importing the previous value held by the data holding circuit, comparing the immediate value and the previous value with each other, extracting the applied voltage data and outputting the extracted applied voltage data.

With the aforementioned configuration, a plurality of pieces of leak data are sampled sequentially in the comparison circuit, and compared with the previous value held in the data holding circuit. Accordingly, the number of lines for sampling the leak data can be reduced. In comparison with the case where a plurality of sampling lines are provided correspondingly to a plurality of monitor MOSFETs, the sampling line formation area can be reduced.

The semiconductor integrated circuit device according to the invention may be adapted so that the comparison circuit outputs the applied voltage data to increase an absolute value of the source-substrate voltage when the immediate value is smaller than the previous value as a result of comparison of the immediate value with the previous value, to decrease the absolute value of the source-substrate voltage when the immediate value is larger than the previous value as the result, and to maintain the source-substrate voltage when the immediate value is equal to the previous value as the result.

With the aforementioned configuration, a source-substrate voltage can be extracted and set by comparing the immediate value with the previous value while reducing the number of lines for sampling the leak data to thereby reduce the sampling line formation area.

The semiconductor integrated circuit device according to the invention may be adapted so that the comparison circuit outputs the applied voltage data to increase an absolute value of the source-drain voltage when the immediate value is smaller than the previous value as a result of comparison of the immediate value with the previous value, to decrease the absolute value of the source-drain voltage when the immediate value is larger than the previous value as the result, and to maintain the source/drain voltage when the immediate value is equal to the previous value as the result.

With the aforementioned configuration, a source-drain voltage can be extracted and set by comparing the immediate value with the previous value while reducing the number of lines for sampling the leak data to thereby reduce the sampling line formation area.

The semiconductor integrated circuit device according to the invention may be adapted so that the data holding circuit has a register for storing the previous value.

With the aforementioned configuration, a register which can be formed together with the semiconductor integrated circuit device in a manufacturing process thereof is provided. Accordingly, in comparison with the case where a storage unit is provided separately, the semiconductor integrated circuit device becomes inexpensive, and can extract the applied voltage data at a high speed.

The semiconductor integrated circuit device according to the invention may be adapted so that the register includes a sample-and-hold circuit for sampling and holding analog data.

With the aforementioned configuration, the leak data can be sampled directly without performing any process such as digital conversion thereon. Accordingly, the applied voltage data can be extracted at a high speed.

The semiconductor integrated circuit device according to the invention may be adapted so that the comparison operation circuit holds increase/decrease information indicating increase or decrease of an absolute value of the source-substrate voltage, and outputs the applied voltage data to increase the absolute value of the source-substrate voltage when the immediate value is smaller than the previous value as a result of comparison of the immediate value with the previous value after information indicating increase of the absolute value has been set in the increase/decrease information, to decrease the absolute value of the source-substrate voltage when the immediate value is larger than the previous value as the result to decrease the absolute value of the source-substrate voltage when the immediate value is smaller than the previous value as a result of comparison of the immediate value with the previous value after information indicating decrease of the absolute value has been set in the increase/decrease information, and to increase the absolute value of the source-substrate voltage when the immediate value is larger than the previous value as the result.

With the aforementioned configuration, a source-substrate voltage is extracted and set by the result of comparison between the immediate value and the previous value in accordance with the increase/decrease information while reducing the number of lines for sampling the leak data to thereby reduce the sampling line formation area. Accordingly, the source-substrate voltage can be extracted with high accuracy.

The semiconductor integrated circuit device according to the invention may be adapted so that the monitor MOSFETs are formed out of MOSFETs which are of one kind of N-type MOSFET and P-type MOSFET.

With the aforementioned configuration, for example, no CMOSFET in which an N-type MOSFET and a P-type MOSFET are mixed is used as the monitor MOSFETs. Accordingly, a gate current can be prevented from being included in the leak current, so that the reliability in the applied voltage setting conditions is improved.

The semiconductor integrated circuit device according to the invention may be adapted so that the monitor MOSFETs are formed in the same process specification as the functional MOSFETS.

With the aforementioned configuration, the properties of the functional MOSFETs can be monitored truly even if there is a variation in process. Accordingly, the reliability in the applied voltage setting conditions is improved.

The semiconductor integrated circuit device according to the invention may be adapted so that the circuit body includes a plurality of MOSFET blocks each made of a plurality of the functional MOSFETs, and the monitor MOSFETs are formed in the same device specifications as those of the functional MOSFETs in each MOSFET block.

With the aforementioned configuration, components depending on the device specifications such as channel length or channel width can be eliminated from the leak data. Accordingly, the reliability in the applied voltage setting conditions is improved.

The semiconductor integrated circuit device according to the invention may be adapted so that the applied voltage output circuit accepts a mode changeover signal indicating whether an applied voltage should or not be set and outputted to the circuit body based on the applied voltage data from the comparison operation circuit.

With the aforementioned configuration, preference can be given to suppression of the leak current when high-speed operation is not required. Accordingly, the power consumption can be saved effectively.

The semiconductor integrated circuit device according to the invention may be adapted to further include a temperature detection circuit for detecting temperature of the semiconductor integrated circuit, and operating the leak current detection circuit, the comparison operation circuit and the applied voltage output circuit when the temperature reaches a predetermined temperature.

With the aforementioned configuration, when there is a change in an external environment, for example, when the device is put in a high-temperature environment, the increase of the leak current can be suppressed. Accordingly, the power consumption can be saved effectively.

The semiconductor integrated circuit device according to the invention may be adapted to further include a power supply voltage detection circuit for detecting a power supply voltage of the semiconductor integrated circuit, and operating the leak current detection circuit, the comparison operation circuit and the applied voltage output circuit when the power supply voltage reaches a predetermined value.

With the aforementioned configuration, when there is a change in an external environment, for example, when there is a fluctuation in the power supply voltage, the increase of the leak current can be suppressed. Accordingly, the power consumption can be saved effectively.

The semiconductor integrated circuit device according to the invention may be adapted so that the applied voltage output circuit includes a limit value storage unit for holding a limit value of at least one of an upper limit voltage and a lower limit voltage of an applied voltage to be outputted to the circuit body; and when an applied voltage of the functional MOSFETs reaches the limit value, the applied voltage is maintained to be equal to the limit value.

With the aforementioned configuration, the applied voltage can be prevented from exceeding a limit value defined by the reliability of the semiconductor integrated circuit. Accordingly, the reliability can be kept.

The semiconductor integrated circuit device according to the invention may be adapted so that the data holding circuit samples the leak data newly whenever there is a change in an output value of the comparison circuit.

With the aforementioned configuration, the applied voltage data is extracted only when the leak current increases or decreases. Accordingly, the power consumption can be saved while suppressing the increase of the leak current.

The semiconductor integrated circuit device according to the invention may be adapted to further include a clocking device for measuring time, wherein at least extraction of the applied voltage data is performed when the clocking device measures a predetermined time.

With the aforementioned configuration, the leak current can be prevented from increasing due to deterioration of the device with age or the like. Accordingly, the power consumption can be saved effectively.

The semiconductor integrated circuit device according to the invention may be adapted to further include a nonvolatile memory for storing at least a period of warrant of a product.

With the aforementioned configuration, the period of warrant of the product is stored in the nonvolatile memory. Accordingly, the leak current can be suppressed in accordance with the number of years of reliability. Thus, the power consumption can be saved effectively while the reliability is improved.

The semiconductor integrated circuit device according to the invention may be adapted so that the applied voltage data are stored in the nonvolatile memory, and the applied voltage data stored in the nonvolatile memory is outputted to the applied voltage output circuit when there is a change of an external environment in a start-up period or the like.

With the aforementioned configuration, the applied voltage data are stored in the nonvolatile memory. Accordingly, the leak current can be suppressed when there is a fluctuation in the applied voltage data. Thus, the power consumption can be saved effectively.

The semiconductor integrated circuit device according to the invention may be adapted so that a detection value detected by the power supply voltage detection circuit or the temperature detection circuit is stored in the nonvolatile memory.

With the aforementioned configuration, a detection value corresponding to an external environment such as a power supply voltage or a temperature is stored in the nonvolatile memory. Accordingly, the leak current can be suppressed in accordance with a fluctuation in the external environment. Thus, the power consumption can be saved effectively.

According to the invention, applied voltage data minimizing the leak current is extracted from the leak data, and the applied voltage is set and applied to the circuit body based on the extracted applied voltage data.

Accordingly, the power consumption can be saved even when there is a variation in process, and while preventing the leak current from increasing due to a GIDL phenomenon or a BTBT phenomenon. Further, the leak current can be further suppressed in accordance with the device temperature so as to save the power consumption.

BRIEF DESCRIPTION OF THE DRAWINGS

FIGS. 14A to 14C are tables of bit information (increase/decrease information) stored in the comparison circuit.

FIG. 15 is a state transition table of the extraction process corresponding to the bit information.

DESCRIPTION OF THE PREFERRED EMBODIMENTS

Embodiments of the invention will be described with reference to the drawings.

First Embodiment

Figure 1:
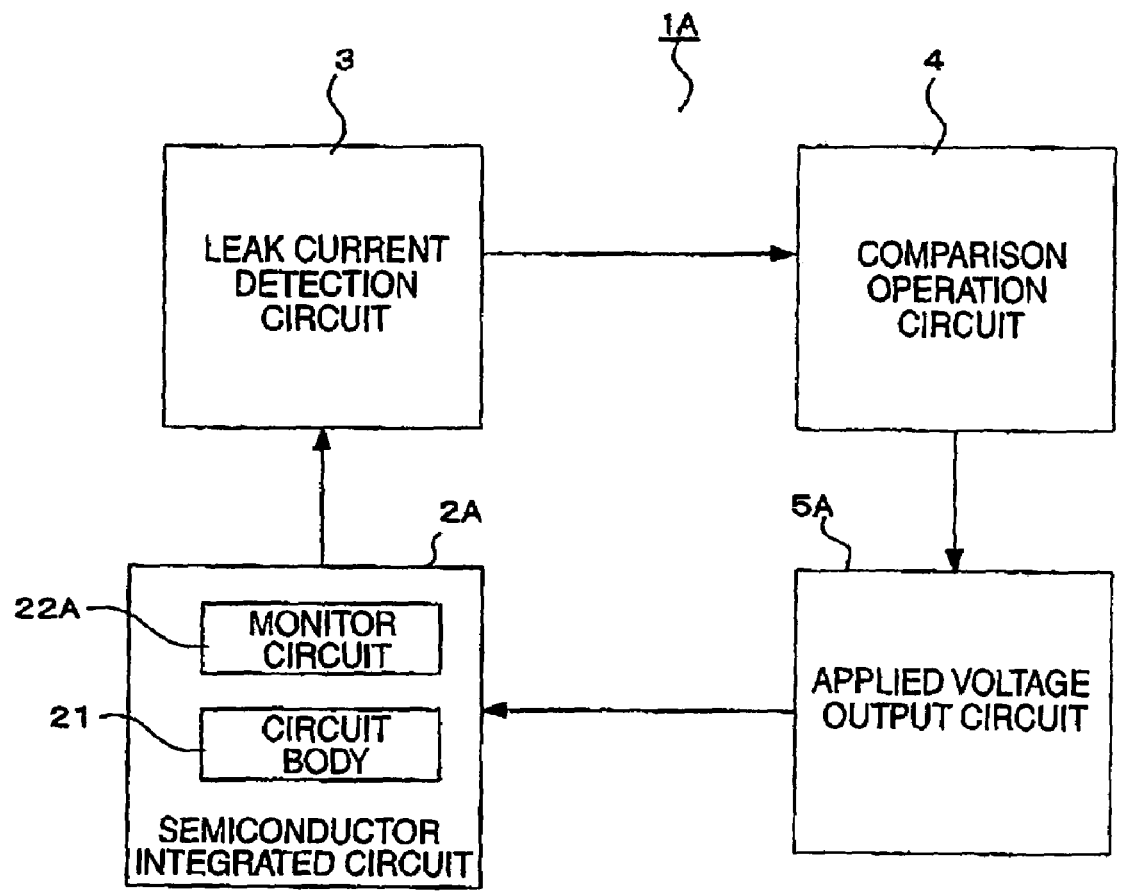
FIG. 1 is a block diagram of a semiconductor integrated circuit device applied to description of a first embodiment.

FIG. 1 is a block diagram showing the schematic configuration of a semiconductor integrated circuit device 1A according to a first embodiment of the invention. The semiconductor integrated circuit device 1A includes a semiconductor integrated circuit 2A, a leak current detection circuit 3, a comparison operation circuit 4 and an applied voltage output circuit 6A.

The semiconductor integrated circuit 2A has a circuit body 21 and a monitor circuit 22A. The circuit body 21 has a plurality of MOSFETs and performs predetermined functional operations as microprocessors, digital signal processors, etc. The monitor circuit 22A has MOSFETs formed in the same process specifications as the MOSFETs of the circuit body 21. Leak currents from the MOSFETs (hereinafter referred to as "monitor MOSFETs") in the monitor circuit 22A are detected so that the source-substrate voltage or the like of the MOSFETs (hereinafter referred to as "functional MOSFETs") of the circuit body 21 can be adjusted based on the result of the detection.

The MOSFETs may be either N-type MOSFETs (hereinafter referred to as "NMOSFETs") or P-type MOSFETs (hereinafter referred to as "PMOSFETs"). The following description will be made on the case of NMOSFETs by way of example. Similar processing can be performed in the case of PMOSFETs. If it is necessary to distinguish between NMOSFETs and PMOSFETs especially, special description will be made on PMOSFETs. As a rule, description will be made on enhancement-type NMOSFETs by way of example.

It is desired that the monitor MOSFETs are manufactured in a single manufacturing process. When dual-threshold MOSFETs are used as the monitor MOSFETs, it is desired that a leak current is monitored for each threshold, and a proper voltage is applied to each monitor MOSFET.

Figure 2:
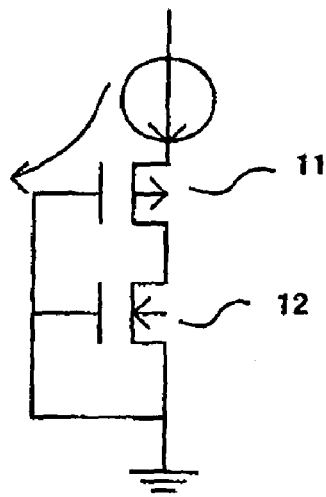
FIG. 2 is a diagram for explaining the state where a gate leak current is included in a leak current in a CMOS configuration.

It is also desired that each monitor MOSFET is made of a single MOSFET. This reason will be described. Assume that a CMOS configuration made of a PMOSFET 11 and an NMOSFET 12 as shown in FIG. 2 is used as the monitor MOSFET. Then, the PMOSFET 11 may be turned on to allow a gate current to flow through a gate oxide film of the PMOSFET 11 from its source and substrate. In such a case, it is difficult to detect only a source-rain leak current so that it is difficult to extract and set applied voltage data properly. Needless to say, when a gate current can be monitored, only the source-drain leak current can be extracted from a detected leak current. In such a case, however, an extraction unit must be provided separately while the circuit becomes complicated.

Further, as for the device specifications such as the device size (for example, channel length or channel width) of each monitor MOSFET, it is desired that the monitor MOSFET has a typical size as a functional MOSFET. That is, in a certain circuit configuration, for example, in an area including only SRAMs, it is desired that the monitor MOSFET is formed with a device size as large as the device size of each SRAM. This is because an optimum substrate voltage or the like for a leak current will differ from one device to another due to SCE (Short Channel Effect) if they are different in size.

Here, NMOSFETs may be connected in series in an NAND circuit or the like having a CMOS logical configuration. In such a circuit, not a source of an NMOSFET dose to the output side of the NAND circuit but a source of an NMOSFET the farthest from the output side is regarded as a source of a transistor to be monitored in this embodiment. The same thing can be also applied to PMOSFETs.

The leak current detection circuit 3 detects leak currents from a plurality of monitor MOSFETs, and outputs detection results thereof to the comparison operation circuit 4. Specifically, a source-drain voltage of each monitor MOSFET when a current having a predetermined value is applied between the source and the drain of the monitor MOSFET is detected and outputted as leak data. The following description will be made on the case where a leak current value is detected by a voltage value by way of example. However, the invention is not limited thereto. The leak current value may be detected by a current value.

The comparison operation circuit 4 extracts, from the leak data, leak data of a monitor MOSFET indicating the smallest leak current, and outputs the result thereof as applied voltage data to the applied voltage output circuit 5A.

The applied voltage output circuit 5A sets a source-substrate voltage to be applied to the functional MOSFETs based on the applied voltage data from the comparison operation circuit 4, and outputs the set source-substrate voltage to the semiconductor integrated circuit 2A.

Figure 3:
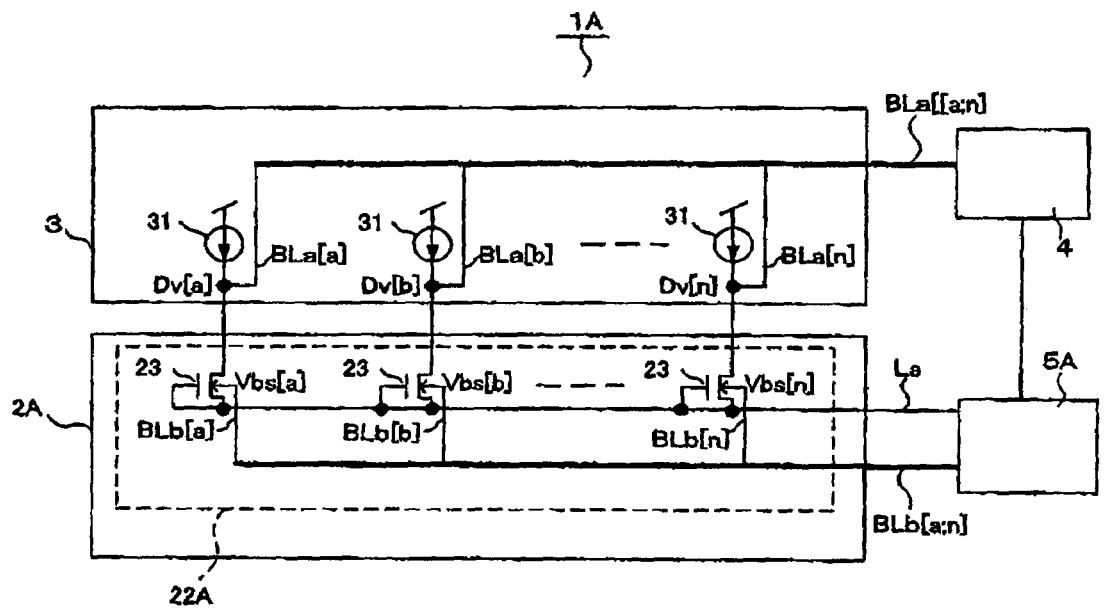
FIG. 3 is a block diagram of the semiconductor integrated circuit device, showing the details of a monitor circuit and a leak current detection circuit.

FIG. 3 is a block diagram of the semiconductor integrated circuit device 1A, showing the details of the configuration of the monitor circuit 22A and the leak current detection circuit 3 in the semiconductor integrated circuit 2A in the leak current detection circuit 3, a plurality of current sources 31 . . . 31 are provided correspondingly to a plurality of monitor NMOSFETs 23 . . . 23 provided in the monitor circuit 22A. Incidentally, the current sources 31 are arranged to apply currents having one and the same value.

Each current source 31 is connected to the drain of its corresponding monitor NMOSFET 23, and a leak data bus BLa [a:n] is connected to a connection point between the both. On the other hand, a substrate voltage bus BLb [a:n] is connected to the substrate. Each of the leak data bus BLa and the substrate voltage bus BLb is a bus constituted by n (integer) lines, Each line is connected to the drain of its corresponding monitor NMOSFET 23 and the substrate.

The gate and the source of each monitor NMOSFET 23 are connected to a source supply line La which is a common line. Accordingly, when the potential of the source supply line is "0" V, each monitor NMOSFET 23 is turned off. When there is a leak current in the monitor NMOSFET 23, a sub-threshold current thereof increases in accordance with the leak current.

Each current source 31 is a constant current source necessary and sufficient to supply the sub-threshold current, so as to prevent an excessive voltage from being applied between the source and the drain. Description will be made on the assumption that the potential of the source supply line La is "0" V for the sake of simplification of the description. However, the invention is not limited thereto.

When the sub-threshold current is regarded as a leak current, a source-drain voltage drop caused by the flow of the leak current is detected as leak data Dv [a:n]. That is, a leak current value is detected as a voltage value.

Figure 4:
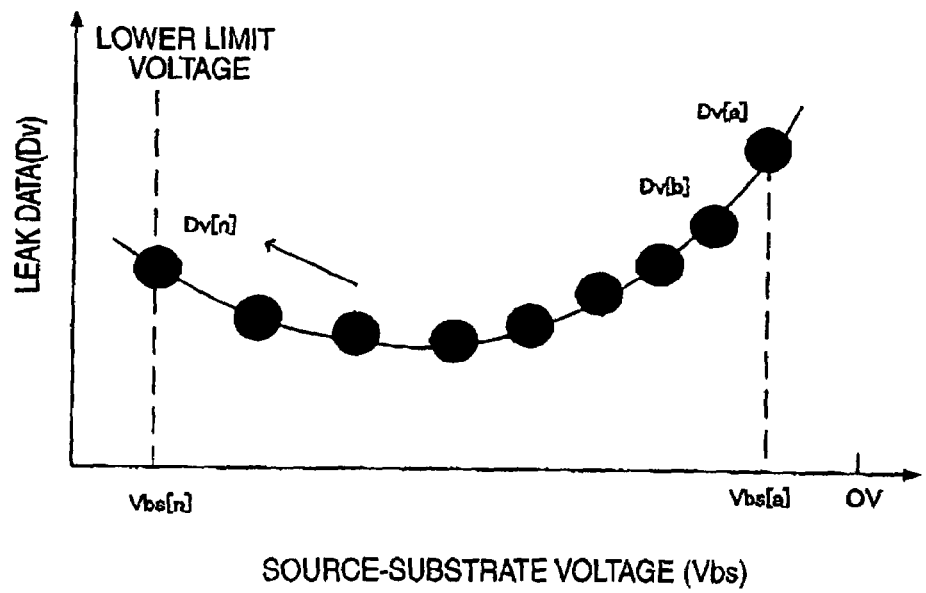
FIG. 4 is a graph showing leak data of monitor MOSFETs different in source-substrate voltage by way of example.

FIG. 4 is a graph showing leak data Dv detected thus with respect to each monitor NMOSFET 23. The value of the lower limit voltage is a voltage value determined in accordance with the reliability of the semiconductor, FIG. 4 shows the case where the source-substrate voltages applied to the monitor MOSFETs 23 have different voltage values Vbs [a:n]. Accordingly, even when the monitor MOSFETs 23 are identical in source potential, gate potential and drain potential, leak currents therefrom differ in accordance with their substrate voltages Vbs. Not to say, the invention is not limited to the configuration in which the source-substrate voltages of the monitor NMOSFETs 23 are set at different values. The source-substrate voltages may be set to be identical to one another.

The n pieces of leak data Dv are sent to the comparison operation circuit 4 through the leak data bus BLa. In the comparison operation circuit 4, leak data Dv minimizing a leak current is extracted, and designation of a line in the leak data bus BLa corresponding to the extracted leak data Dv is outputted to the applied voltage output circuit 5A shown in FIG. 5.

The applied voltage output circuit 5A has a standard voltage generating portion 51 and a comparison output portion 52. The standard voltage generating portion 51 has an NMOSFET 53 and a current source 54. The NMOSFET 53 is provided so that ground potential VSS can be selected as its gate potential. The current source 54 is connected to the drain of the NMOSFET 53. The NMOSFET 53 outputs its source-drain voltage to the comparison output portion 52 as a standard voltage. The substrate of the NMOSFET 53 is connected to the output of the comparison output portion 52. The NMOSFET 53 can be also used as the monitor NMOSFET 23, and the current source 54 can be also used as the current source 31 in the lead current detection circuit 3.

When the gate of the NMOSFET 53 is connected to the VSS side, the NMOSFET 53 is turned off, and the source-drain voltage at that time serves as a standard voltage.

The comparison output portion 52 has an upper limit register 55 for storing an upper limit voltage of a source-substrate voltage to be applied to the circuit body 21, a lower limit register 56 for storing a lower limit voltage of the source-substrate voltage, a comparator 57 for comparing the output voltage Vbs with the upper limit voltage, a comparator 58 for comparing the output voltage Vbs with the lower limit voltage, limiter NMOSFETs 59 and 60 operated by the outputs of the comparators 57 and 58 respectively, and so on. The comparison output portion 52 compares the leak data Dv from the comparison operation circuit 4 with the standard voltage from the standard voltage generating portion 51, and outputs a voltage between the upper limit voltage and the lower limit voltage.

The upper and lower limit voltage values are set within a range in which no GIDL phenomenon occurs, for example, in the following manner when the manufacturing process has been completed. That is, the source-substrate voltage of the NMOSFET 53 is changed to the negative side. A voltage value minimizing the drain current is stored in the upper limit register 55. Next, the source-substrate voltage of the NMOSFET 53 is changed to the positive side. A voltage value maximizing the drain current is stored in the lower limit register 56.

The upper limit voltage set thus is compared with the output voltage in the comparator 57. In accordance with the result of the comparison, the upper limit of the output voltage is limited by turning on/off the limiter NMOSFET 59. In the same manner, the lower limit voltage is compared with the output voltage in the comparator 58. In accordance with the result of the comparison, the lower limit of the output voltage is limited by turning on/off the limiter NMOSFET 60.

Figure 6:
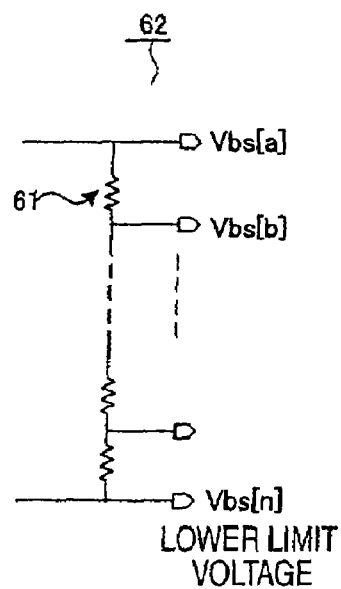
FIG. 6 is a diagram showing a voltage dividing circuit

The set output voltage is applied as a substrate voltage Vbs to the substrates of the functional NMOSFETs. In addition, the substrate voltage Vbs and the lower limit voltage branched by a voltage dividing circuit 62 constituted by a plurality of resistors 61 as shown in FIG. 6 are applied as voltages Vbs [a:n] to the substrates of the monitor NMOSFETs 23. For the substrates of the functional PMOSFETs and the monitor PMOSFETs, substrate voltages are set and applied in a comparison process similar to the aforementioned one.

As described above, a source-substrate voltage is set to minimize a leak current from the functional MOSFETs based on leak currents from the monitor MOSFETs. Accordingly, even when there is a variation in process or when there is a fluctuation in temperature or voltage, the power consumption can be saved without increasing the leak current due to a GIDL phenomenon or a BTBT phenomenon.

Second Embodiment

Next, a second embodiment will be described. Constituent members the same as those in the first embodiment are referenced correspondingly, and description thereof will be omitted. In this embodiment, a leak current is suppressed by adjusting a source-drain voltage.

Figure 7:
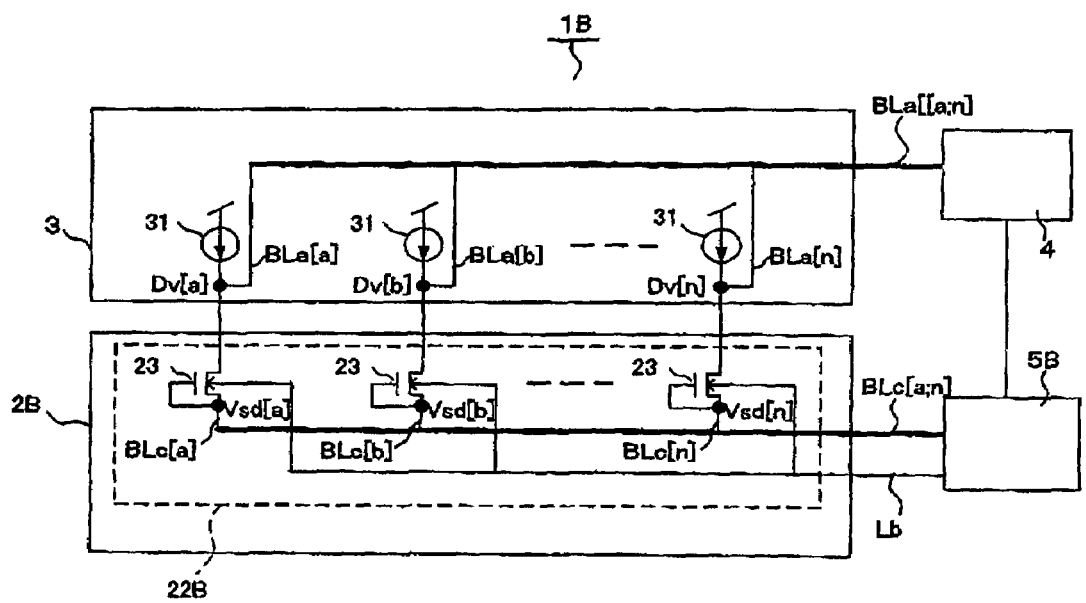
FIG. 7 is a block diagram of a semiconductor integrated circuit device applied to description of a second embodiment.

FIG. 7 is a block diagram of a semiconductor integrated circuit device 1B according to this embodiment, showing the details of the configuration of a monitor circuit 22B in a semiconductor integrated circuit 2B and the leak current detection circuit 3. The monitor circuit 22B has a configuration similar to that of the monitor circuit 22A. However, gates and sources of a plurality of monitor NMOSFETs 23 are connected to each other, and connected to an applied voltage output circuit 5B through a source voltage bus BLc [a:n]. In addition, drains of the monitor NMOSFETs 23 are connected to current sources 31 respectively, and a leak data bus BLa [a:n] is connected to connection points between the drains and the current sources 31. Further, the substrates of the plurality of monitor NMOSFETs 23 are connected to a ground supply line Lb which is a common line.

That is, in the configuration shown in FIG. 3, the gates and the sources of the monitor NMOSFETs 23 are connected to the source supply line La, while different voltages are applied as substrate voltages of the monitor NMOSFETs 23 through the substrate voltage bus BLb. On the other hand, in the configuration shown in FIG. 7, different voltages are applied between the gates and the sources of the monitor NMOSFETs 23 respectively through the source voltage bus BLc, while the substrates of the monitor NMOSFETs 23 are connected to the substrate voltage supply line Lb.

Incidentally, as described above, the monitor circuit 22B has the same constituent members as those of the monitor circuit 22A though there is a difference in connection method. Therefore, the connection method may be changed in the applied voltage output circuit 5B.

In the aforementioned configuration, a source-drain current flowing with a voltage applied between the source and the gate of each monitor NMOSFET 23 is regarded as a leak current, and the source-drain voltage at that time is detected as leak data Dv [a:n].

The n pieces of leak data Dv detected thus are sent to the comparison operation circuit 4 through the leak data bus BLa. In the comparison operation circuit 4, of the n pieces leak data Dv, leak data Dv indicating the smallest leak current is detected, and a line of the leak data bus BLa corresponding to the detected leak data Dv is specified and outputted as applied voltage data to the applied voltage output circuit 5B shown in FIG. 8.

The applied voltage output circuit 5B has a regulator circuit configuration, in which the leak data Dv from the comparison operation circuit 4 or a normal operating voltage is inputted into one input terminal of a comparator 63, while the output voltage is supplied to the other input terminal of the comparator 63. The normal operating voltage is a power supply voltage (power supply voltage rated in the specifications of the device) in the normal state of the device. When the output voltage is used as a standard voltage of the comparator 63, the output voltage can be changed in accordance with whether the leak data Dv or the normal operating voltage is higher than the standard voltage or not.

Figure 9:
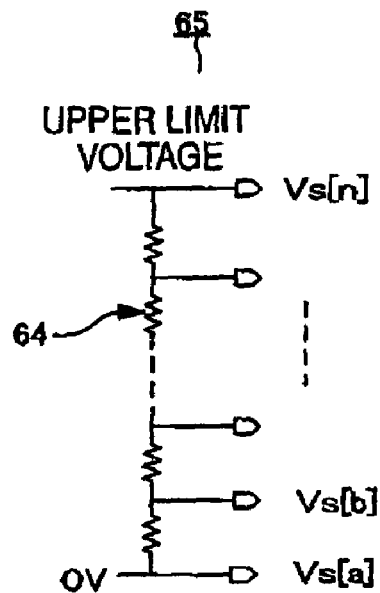
FIG. 9 is a diagram showing a voltage dividing circuit.

The output voltage set thus is applied to the source of each functional NMOSFET as a source-drain voltage Vsd. In addition, the source-drain voltage Vsd and an upper limit voltage branched by a voltage dividing circuit 65 constituted by a plurality of resistors 64 shown in FIG. 9 are applied as voltages Vs [a:n] between sources and gates of the monitor NMOSFETs 23. For the substrates of the functional PMOSFETs and the monitor PMOSFETs, a source-drain voltage is set in a comparison process similar to the aforementioned one.

As described above, a source-drain voltage is set to minimize a leak current from the functional MOSFETs based on leak currents from the monitor MOSFETs. Accordingly, even when there is a variation in process, the power consumption can be saved without increasing the leak current due to a GIDL phenomenon or a BTBT phenomenon.

The invention does not prohibit the first and second embodiments to be used together. The source-substrate voltage may be optimized and applied with the optimized source-drain voltage being applied, so as to minimize the leak current.

Third Embodiment

Next, a third embodiment will be described. Constituent members the same as those in the first and second embodiments are referenced correspondingly, and description thereof will be omitted. In the first and second embodiments, the leak current detection circuit 3 and the comparison operation circuit 4 are connected through the leak data bus BLa. On the other hand, in this embodiment, a leak current detection circuit 3 and a comparison operation circuit 4 are connected not through a bus but through a line, while leak data Dv of monitor NMOSFETs 23 can be sampled sequentially.

Figure 10:
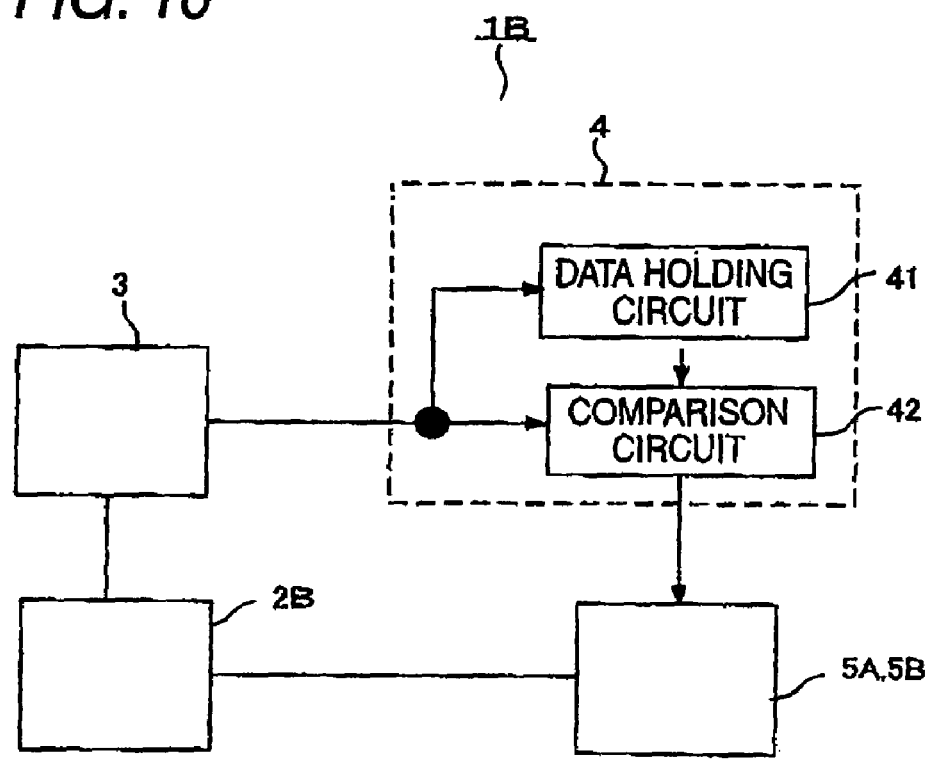
FIG. 10 is a block diagram of a semiconductor integrated circuit device applied to description of a third embodiment.

FIG. 10 is a block diagram of the comparison operation circuit 4 according to this embodiment, which has a data holding circuit 41 and a comparison circuit 42. Leak data Dv from the leak current detection circuit 3 are inputted to the data holding circuit 41 and the comparison circuit 42.

The data holding circuit 41 operates in response to a trigger signal so as to sample the leak data Dv and hold the leak data Dv till a subsequent trigger signal is inputted. When the data holding circuit 41 is holding the leak data Dv, the data holding circuit 41 outputs the held leak data Dv as a previous value to the comparison circuit 42.

The comparison circuit 42 samples the leak data Dv as an immediate value successively, compares the immediate value with the previous value, extracts leak data Dv minimizing the leak current, and outputs the extracted leak data Dv as applied voltage data to the applied voltage output circuit 5A or 5B.

In this event, when the previous value and the immediate value are analog data, that is, when the leak data Dv are analog data, the leak data Dv may be converted into a digital signal by an A/D converter or the like before the process of comparison performed thereon, or the leak data Dv may be handled directly as analog data.

Figure 11:
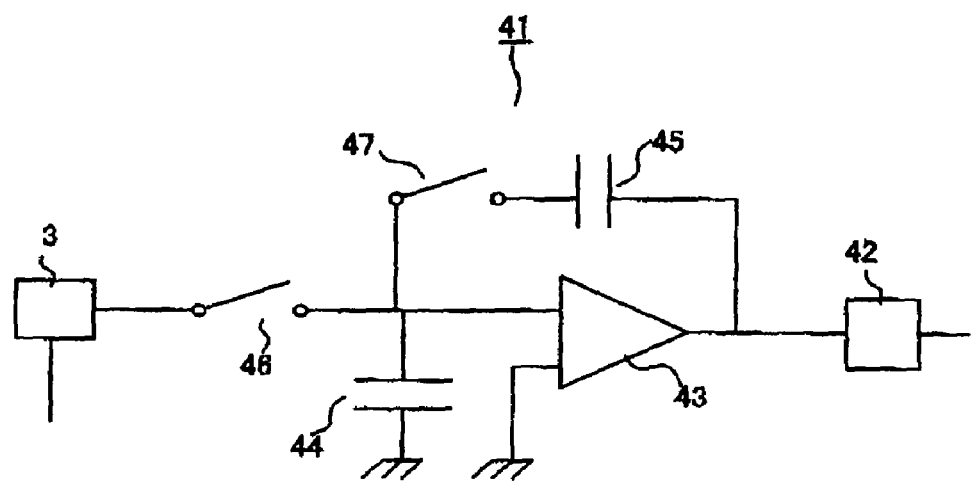
FIG. 11 is a configuration diagram of a data holding circuit constituted by a sample-and-hole circuit.

When the analog data are handled as they are, for example, a data holding circuit 41 constituted by a sample-and-hold circuit as shown in FIG. 11 can be used. The data holding circuit 41 includes a comparator 43, a first capacitor 44, a second capacitor 45, a first switch 46 and a second switch 47 for sampling and holding data based on a trigger signal and an inverted trigger signal.

That is, one input terminal of the comparator 43 is grounded, while the other input terminal of the comparator 43 is grounded through the first capacitor 44. To the latter input terminal, the leak data Dv from the leak current detection circuit 3 are inputted through the first switch 46, and the output of the comparator 43 is inputted through the second capacitor 45 and the second switch 47.

One of the first and second switches 46 and 47 operates in accordance with a trigger signal while the other operates in accordance with a phase-inverted signal of the trigger signal. For example, the first switch 46 closes the circuit when the trigger signal is in an "H" level, and opens the circuit when the trigger signal is in an "L" level. When the first switch 46 is closed, leak data Dv are inputted to the comparator 43, and a voltage value thereof is outputted, while the first capacitor 44 is charged therewith. On the other hand, the second switch 47 opens the circuit when the inverted trigger signal is in an "H" level. When the inverted trigger signal is in an "L" level, the second switch 47 closes the circuit so that the second capacitor 45 is charged to hold the leak data Dv.

Figure 12:
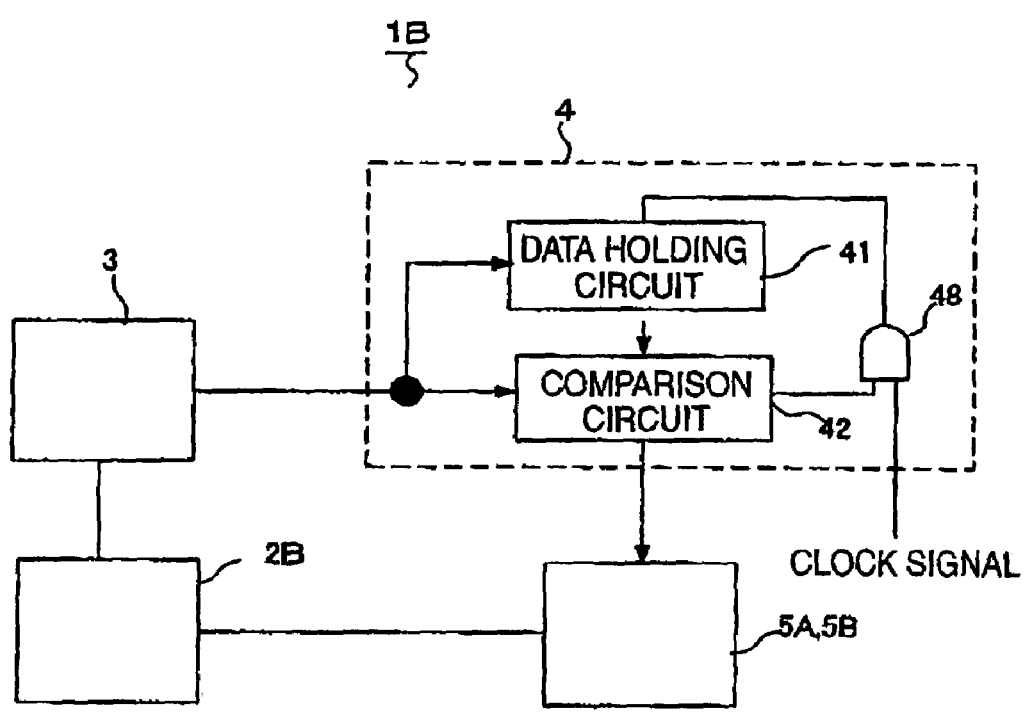
FIG. 12 is a block diagram of a semiconductor integrated circuit device using the data holding circuit constituted by a sample-and-hole circuit.

FIG. 12 is a diagram showing the configuration of the comparison operation circuit 4 having the aforementioned data holding circuit 41 operating in accordance with the trigger signal. A clock signal and an output signal (that is, applied voltage data) of the comparison circuit 42 are supplied to inputs of a two-input AND gate 48. The signal supplied from the comparison circuit 42 to the two-input AND gate 48 varies in accordance with a change of leak data Dv inputted into the comparison circuit 42. Thus, a trigger signal is outputted to the data holding circuit 41 synchronously with the clock signal so that the leak data Dv is sampled and held.

Such a process is performed on leak data Dv of each monitor NMOSFET 23 sequentially. Thus, leak data Dv minimizing the leak current can be extracted without connecting the leak current detection circuit 3 and the comparison operation circuit 4 through a bus.

Accordingly, the bus formation area required for a bus configuration can be saved. In addition, the data holding circuit 41 operates only when there is a change in the leak data Dv inputted into the comparison circuit 42. It is therefore possible to save the power consumption in the comparison operation circuit 4.

Fourth Embodiment

Next, a fourth embodiment will be described. Constituent members the same as those in the first to third embodiments are referenced correspondingly, and description thereof will be omitted. In this embodiment, the accuracy with which the source-substrate voltage is extracted as applied voltage data in the comparison circuit 42 according to the third embodiment is more improved.

Figure 13:
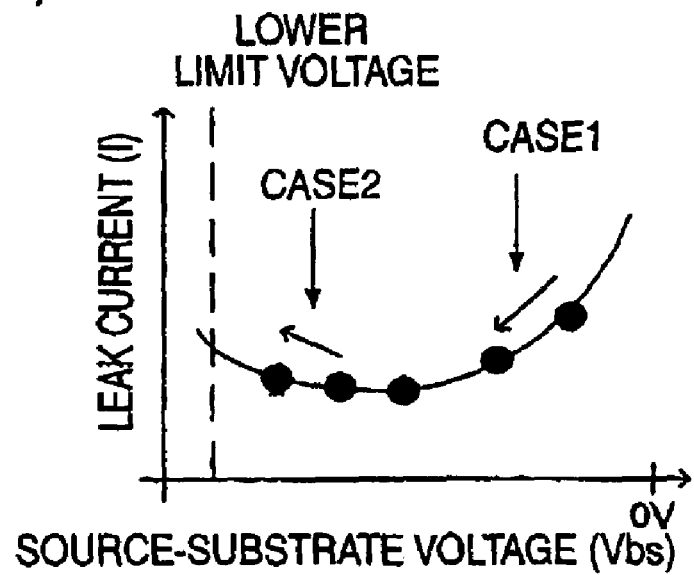
FIGS. 13A and 13B are graphs for explaining an extraction process in a comparison circuit applied to description of a fourth embodiment.
Figure 13:
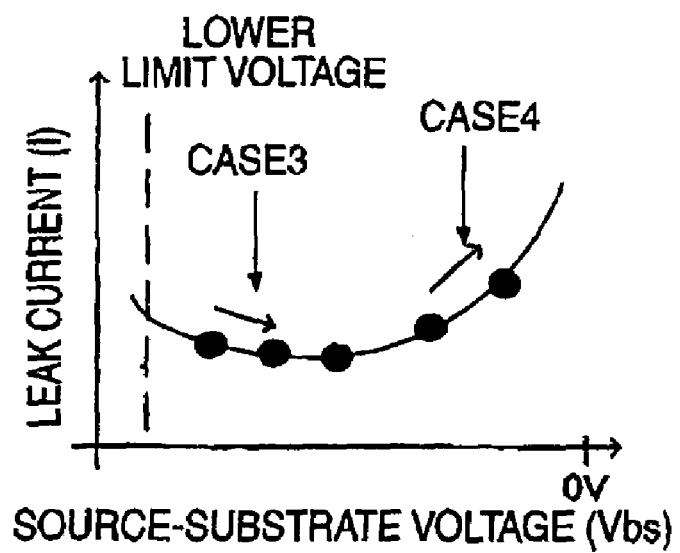

FIGS. 13A and 13B are graphs for explaining the extraction process in the comparison circuit 42. In each of FIGS.

13A and 13B, the abscissa designates a source-substrate voltage (Vbs) of each monitor NMOSFET 23, and the ordinate designates a leak current (I).

FIGS. 14A-14C are tables of bit information (increase/decrease information) stored in the comparison circuit 42. To increase the source-substrate voltage Vbs, an increment/decrement bit PE shown in FIG. 14A is set to be "1" indicating an increment command. On the contrary, to decrease the source-substrate voltage Vbs, the increment/decrement bit PE is set to be "0" indicating a decrement command.

To maintain the source-substrate voltage Vbs, a maintenance bit M shown in FIG. 14B is set to be "1". Not to maintain the source-substrate voltage Vbs, the maintenance bit M is set to be "0".

Further, the change width (step voltage value) with which the source-substrate voltage Vbs is varied is designated by a gear bit G. When the gear bit G is set to be "0", the source-substrate voltage varies at every 0.1 V interval. When the gear bit G is set to be "1", the source-substrate voltage varies at every 0.01 V interval. Not to say, the gear bit G does not have to be limited to 1 bit, but it may be set using multiple bits. When the gear bit G is set using multiple bits, the change width of the source-substrate voltage can be set more minutely. Thus, leak data minimizing the leak current can be extracted with higher accuracy.

Figure 16:
FIG. 16 is a timing chart of initial operation and start up at state maintenance operation.

FIG. 15 is a state transition table of the extraction process corresponding to each piece of the bit information. In FIG. 15, Previous value P designates a previous value of a leak current, and immediate value I designates an immediate value of the leak current. FIG. 16 is a timing chart showing initial operation or start up at state maintenance operation.

In the initial operation, as shown in FIG. 16, the maintenance bit M is set to be "1" due to the rise of a clock signal (or a starting pulse) so that the voltage-source voltage is maintained. The maintenance bit M and the increment/decrement bit PE are set to be "0" in the next rise of the clock signal.

For example, in the state where the maintenance bit M is "0" and the increment/decrement bit PE is "1", the gear bit G is set to be "0". In Case 1 in FIG. 13A, Previous Value 1 (P) is larger than immediate Value 1 (I) (P>I). Therefore, the increment/decrement bit PE is maintained in the next rise of the clock signal (that is, the increment/decrement bit PE is "1"). Thus, a source-substrate voltage minimizing the leak current is extracted with increase of the source-substrate voltage (correspondingly to a transition state B in FIG. 15).

In Case 2, Previous Value 2 (P) is smaller than Immediate Value 2 (I) (P<I). Therefore, the increment/decrement bit PE is set to be "0" in the next rise of the clock signal. Thus, a source-substrate voltage minimizing the leak current is extracted with decrease of the source-substrate voltage (correspondingly to a transition state A in FIG. 15).

On the other hand, assume that both the maintenance bit M and the increment/decrement bit PE are "0". In this state, in Case 3 in FIG. 15, Previous Value 3 (P) is larger than Immediate Value 3 (I) (P>I). Therefore, the increment/decrement bit PE is maintained in the next rise of the clock signal (that is, the increment/decrement bit PE is "0"). Thus, a source-substrate voltage minimizing the leak current is extracted with decrease of the source-substrate voltage (correspondingly to a transition state D in FIG. 15).

In Case 4, Previous Value 4 (P) is smaller than Immediate Value 4 (I) (P<I). Therefore, the increment/decrement bit PE is set to be "1" in the next rise of the clock signal. Thus, a source-substrate voltage minimizing the leak current is extracted with increase of the source-substrate voltage (correspondingly to a transition state E in FIG. 15).

When the increment/decrement bit PE repeats "1" and "0", the gear bit G is incremented. When the gear bit G is set to be "1", a source-substrate voltage minimizing the leak current is extracted in a procedure similar to the aforementioned one. Accordingly, the source-substrate voltage minimizing the leak current can be extracted with higher accuracy.

When Previous Value P coincides with Intermediate Value I (P=I), or when these values coincide with a lower limit voltage, the maintenance bit PE is set to be "1" (correspondingly to the transition state C or F in FIG. 15).

Accordingly, when the extraction of the source substrate voltage is not completed though it reaches a lower limit voltage depending on the reliability of a product, the source-substrate voltage is maintained to be the lower limit voltage value. Thus, the power consumption can be reduced while the leak current is prevented from increasing due to a GIDL phenomenon.

Fifth Embodiment

Figure 17:
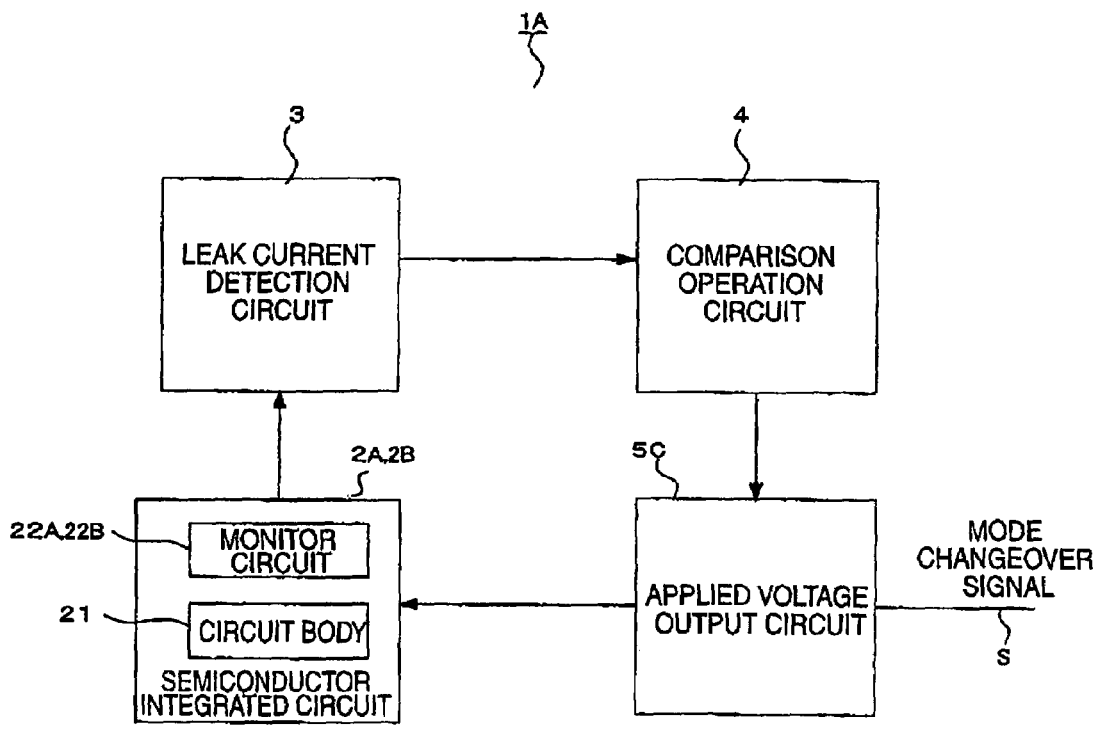
FIG. 17 is a block diagram of a semiconductor integrated circuit device applied to description of a fifth embodiment.

Next, a fifth embodiment will be described. Constituent members the same as those in the first to fourth embodiments are referenced correspondingly, and description thereof will be omitted. In this embodiment, as shown in FIG. 17, the conditions with which the source-substrate voltage or the source-drain voltage is applied to the semiconductor integrated circuit 2A or 2B can be changed over in accordance with a mode changeover signal S by an applied voltage output circuit 5C.

The mode changeover signal S can be changed over between at least two modes. One of the two modes is a normal mode in which a semiconductor integrated circuit device 1C operates with a normal voltage and a normal speed. The other mode is a stop mode in which the semiconductor integrated circuit device 1C operates more slowly than normally or stops.

Figure 18:
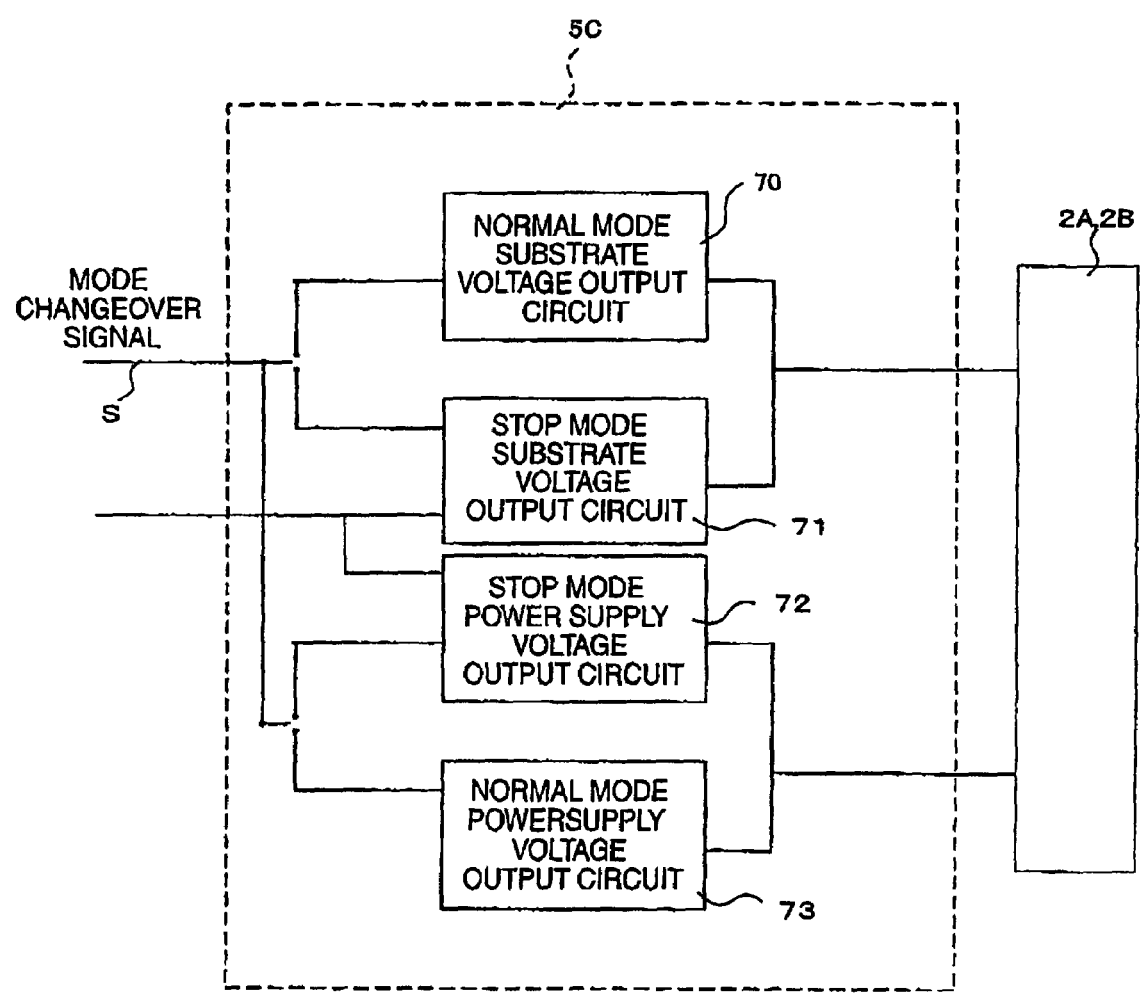
FIG. 18 is a block diagram showing the configuration of an applied voltage output circuit.

FIG. 18 is a diagram showing the configuration of the applied voltage output circuit 5C. The applied voltage output circuit 5C has a normal mode substrate voltage output circuit 70 and a normal mode power supply voltage output circuit 73 operating when the mode changeover signal S indicates the normal mode, and a stop mode substrate voltage output circuit 71 and a stop mode power supply voltage output circuit 72 operating when the mode changeover signal S indicates the stop mode.

Applied voltage data minimizing the leak current, which data has been extracted by the comparison operation circuit 4, is inputted to the stop mode substrate voltage output circuit 71 and the stop mode power supply voltage output circuit 72.

In any MOSFET, a leak current can be reduced when the source-drain voltage is made low. In some mode, the source-drain voltage may be made further lower. Therefore, for example, when the semiconductor integrated circuit device 1C according to the invention is used in a cellular phone, a use mode intended to further reduce the power consumption can be imagined as follows. That is, the state of a call is set as a normal mode. In the state of waiting for a call, in which the load of processing on the hardware is comparatively lighter than that in the normal mode, the source-drain voltage is set to be lower than that in the normal mode.

By changing over between the normal mode and the stop mode in such a manner, the power consumption in the stop mode can be suppressed while the operating speed in the normal mode is prevented from lowering.

Figure 5:
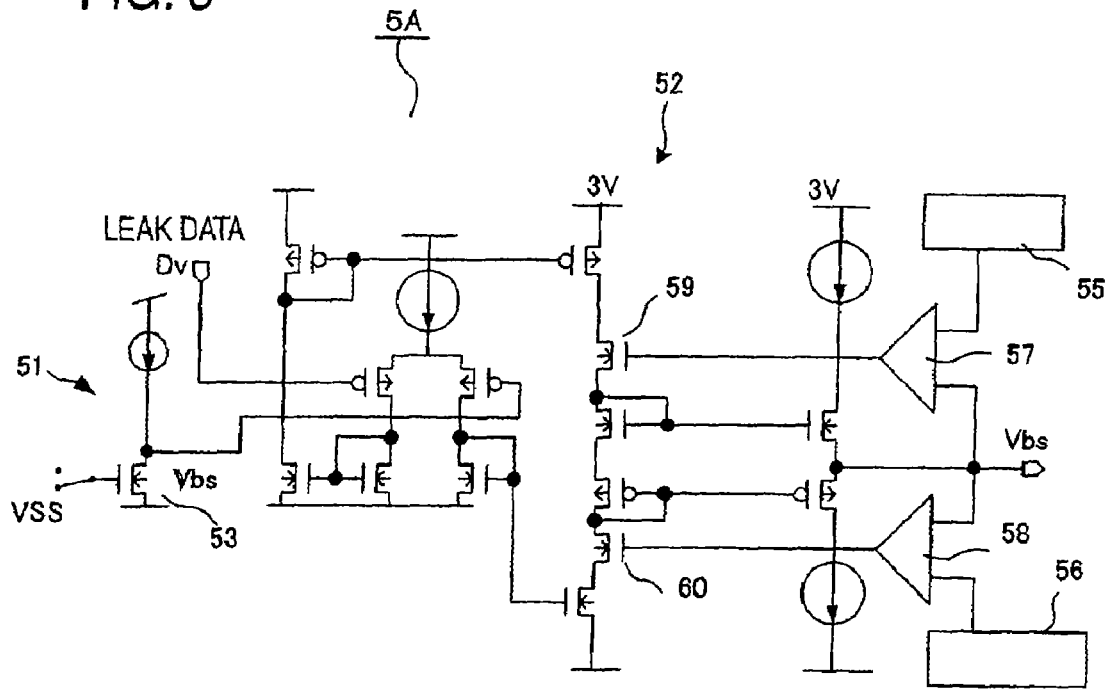
FIG. 5 is a diagram showing the detailed configuration of an applied voltage output circuit.
Figure 8:
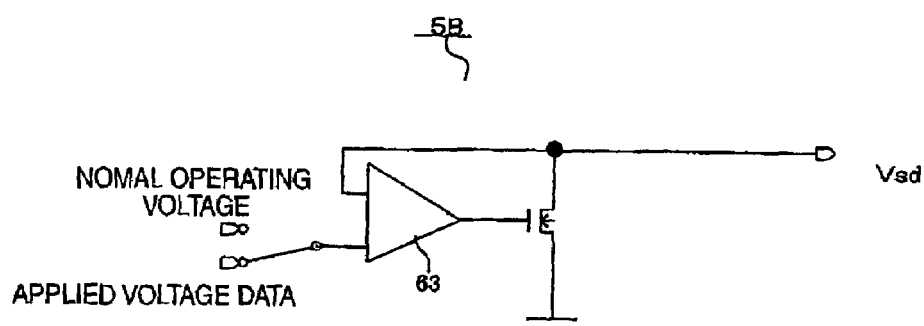
FIG. 8 is a diagram showing the detailed configuration of an applied voltage output circuit.
Figure 20:
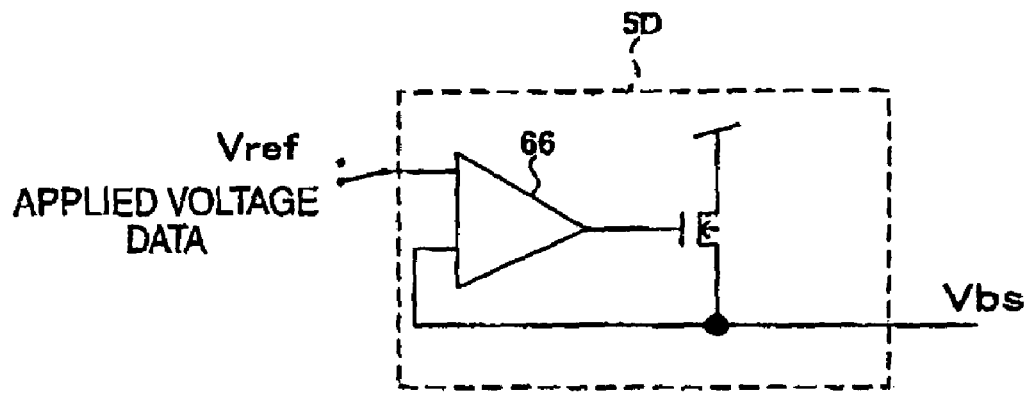
FIG. 20 is a circuit diagram showing the detailed configuration of an applied voltage output circuit having another configuration in place of FIG. 19.
Figure 21:
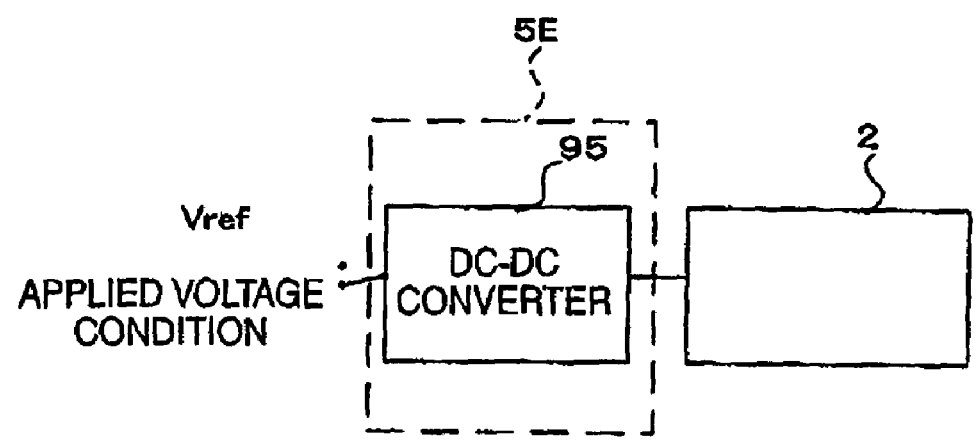
FIG. 21 is a circuit diagram showing the detailed configuration of an applied voltage output circuit having another configuration in place of FIG. 19.

The applied voltage output circuit 5A shown in FIG. 5 described in the first embodiment and the applied voltage output circuit 5B shown in FIG. 8 described in the second embodiment are applicable to the stop mode substrate voltage output circuit 71 and the stop mode power supply voltage output circuit 72. Alternatively, a configuration as shown in FIGS. 19-21 may be used for those circuits 71 and 72.

Figure 19:
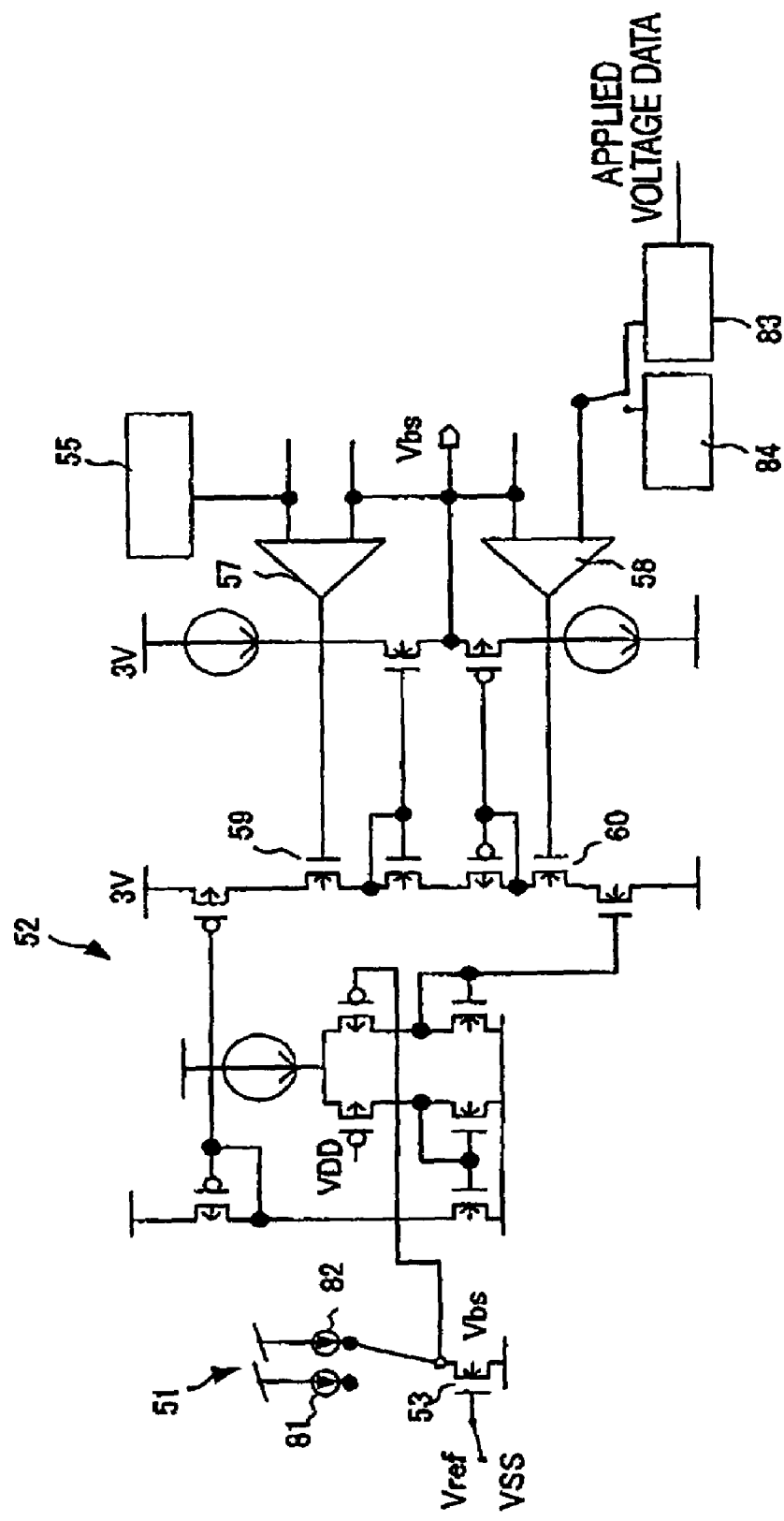
FIG. 19 is a circuit diagram showing the detailed configuration of the applied voltage output circuit.

The applied voltage output circuit 5C shown in FIG. 19 has a configuration similar to that of the applied voltage output circuit 5A shown in FIG. 5. However, the applied voltage output circuit 5C has a normal mode current source 81 and a stop mode current source 82 as current sources. In addition, the applied voltage output circuit 5C has a normal mode lower limit register 84 and a stop mode lower limit register 83.

The current value of the current source 82 is much smaller than that of the current source 81. Leak data Dv minimizing the leak current is inputted from the comparison operation circuit 4 to the lower limit register 83, and stored therein.

With this configuration, in the normal mode, a reference voltage Vref of a power supply voltage or the like is applied to the gate of the NMOSFET 53 of the standard voltage generating portion 51, and the normal mode current source 81 is connected to the drain of the NMOSFET 53, while a lower limit voltage stored in the normal mode lower limit register 84 is inputted to the comparator 58. On the other hand, in the stop mode, a voltage Vss of ground potential or the like is applied to the gate of the NMOSFET 53, and the stop mode current source 82 is connected to the drain of the NMOSFET 53, while a lower limit voltage stored in the stop mode lower limit register 83 is inputted to the comparator 58. The upper limit voltage and the output voltage are compared by the comparator 57. In accordance with the result of the comparison, the limiter NMOSFET 59 is turned on/off to set an upper limit in the output voltage. Similarly, the lower limit voltage and the output voltage are compared by the comparator 58. In accordance with the result of the comparison, the limiter NMOSFET 60 is turned on/off to set a lower limit in the output voltage.

The set output voltage is applied as a source-substrate voltage Vbs to the substrates of the functional NMOSFETs. In addition, the substrate voltage Vbs and the lower limit voltage branched by a voltage dividing circuit are applied as voltages Vbs [a:n] to the substrates of the monitor NMOSFETs 23. For the substrates of the functional PMOSFETs and the monitor PMOSFETs, substrate voltages are set and applied in the same manner as described above.

An applied voltage output circuit 5D having a regulator circuit configuration shown in FIG. 20 has a configuration similar to that of the applied voltage output circuit 5B shown in FIG. 8. However, a reference voltage Vref is inputted to a comparator 66 in the normal mode, while applied voltage data from the comparison operation circuit 4 are inputted thereto in the stop mode.

When the output voltage (source-drain voltage Vbs) is used as a standard voltage of the comparator 66, the source/drain voltage Vbs can be adjusted and set in accordance with whether the applied voltage data or the reference voltage Vref is higher than the standard voltage or not. In addition, the source-drain voltage Vbs and the upper limit voltage branched by a voltage dividing circuit are applied as voltages Vbs [a:n].

FIG. 21 is a block diagram showing the configuration of an applied voltage output circuit 5E having a DC-DC converter circuit configuration. In the normal mode, the applied voltage output circuit 5E is set so that a reference voltage Vref is inputted to a DC-DC converter 95. In the stop mode, the applied voltage output circuit 5E is set so that applied voltage data from the comparison operation circuit 4 are inputted to the DC-DC converter 95.

In accordance with the reference voltage Vref and the applied voltage data, the clock rate of the DC-DC converter 95 is changed. The clock rate when the applied voltage data are inputted becomes lower (due to a small voltage value) than that when the reference voltage Vref is inputted. Thus, the output voltage is lowered Accordingly, the leak current is suppressed in the stop mode so that the power consumption can be reduced.

Sixth Embodiment

Next, a sixth embodiment will be described. Constituent members the same as those in the first to fifth embodiments are referenced correspondingly, and description thereof will be omitted. Any leak current has temperature dependency such that the leak current increases with increase of temperature. Accordingly, in this embodiment, the temperature of a semiconductor integrated circuit is monitored, and when the temperature reaches a predetermined temperature, the substrate voltage or the like is controlled to suppress the increase of power consumption due to the leak current.

Figure 22:
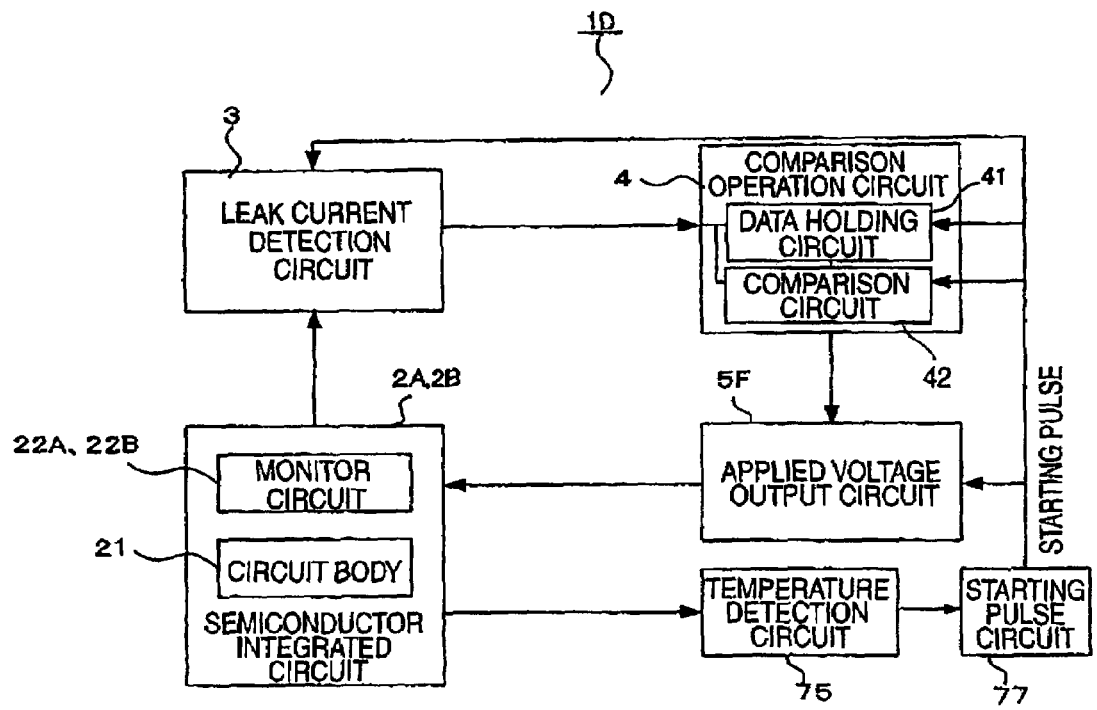
FIG. 22 is a block diagram of a semiconductor integrated circuit device applied to description of a sixth embodiment.
Figure 23:
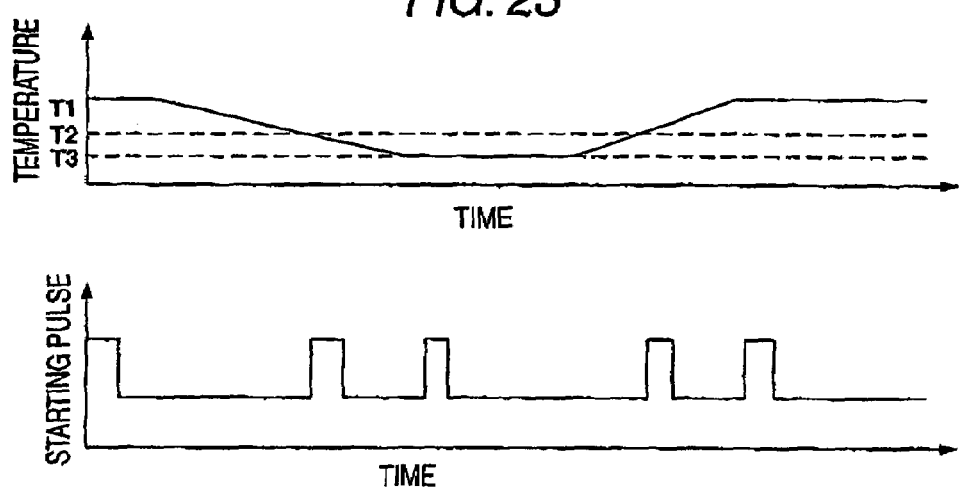
FIG. 23 is a chart showing the operation timing of the semiconductor integrated circuit device in FIG. 22.

FIG. 22 is a block diagram of a semiconductor integrated circuit device 1D configured thus. The semiconductor integrated circuit device 1D has a configuration in which a temperature detection circuit 75 and a starting pulse circuit 77 are added to the configuration shown in FIG. 1. FIG. 23 is a chart showing the operation timing of the semiconductor integrated circuit device 1D.

The output of a not-shown temperature detection member provided in a monitor circuit 22A is inputted to the temperature detection circuit 75, For example, the temperature detection member can be implemented as follows. That is, the gate and the substrate of each monitor NMOSFET 23 are fixed to a constant voltage. Source-drain resistance is measured in that state. The invention is, however, not limited to such a configuration. A device for detecting the temperature may be provided separately.

When the temperature detection circuit 75 importing a signal from the temperature detection member concludes that the temperature reaches a predetermined temperature, the temperature detection circuit 75 outputs a trigger signal to the starting pulse circuit 77. Thus, the starting pulse circuit 77 outputs a starting pulse signal.

The starting pulse signal is supplied to an applied voltage output circuit 5F which is one of the applied voltage output circuits 5A to 5E, the comparison operation circuit 4 and the leak current detection circuit 3. The applied voltage output circuit 5F, the comparison operation circuit 4 and the leak current detection circuit 3 have configurations similar to the aforementioned ones respectively, and they operate only when the starting pulse signal is inputted thereto. For example, the operation or stop of the applied voltage output circuit 5A can be implemented by a configuration in which the mode changeover signal S described in the fifth embodiment is regarded as the starting pulse signal. For the comparison operation circuit 4 and the leak current detection circuit 3, there can be provided a configuration in which power supply to each circuit is controlled by the starting pulse signal. Not to say, the invention is not limited to the aforementioned configurations, but various other configurations are applicable.

When the starting pulse signal is inputted from the starting pulse circuit 77, the leak current detection circuit 3 samples leak data Dv, and inputs the result thereof to the comparison operation circuit 4. Thus, applied voltage data minimizing the leak current is extracted and sent to the applied voltage output circuit 5F. The applied voltage output circuit 5F sets and outputs the source-substrate voltage or the source-drain voltage based on the applied voltage data.

The predetermined temperature set in the temperature detection circuit 75 does not have to be limited to one point, but it may be set at a plurality of temperature points. FIG. 23 shows the case where a starting pulse is outputted as soon as the temperature of the semiconductor integrated circuit 2A or 2B reaches any one of three temperatures T1, T2 and T3.

In the configuration in which the leak current detection circuit 3 and the comparison operation circuit are connected without using a bus so as to sample and compare leak data Dv of a plurality of monitor MOSFETs sequentially as described in the third embodiment, sampling all the leak data Dv may not be completed within the pulse width of the starting pulse. In such a case, for example, it is preferable that a starting pulse continuation signal is outputted from the comparison operation circuit 4 to the starting pulse circuit 77 so that a starting pulse is outputted till the sampling of the leak data Dv is completed.

In the aforementioned description, the temperature of the semiconductor integrated circuit 2A or 2B is detected to intermittently operate the applied voltage output circuit 5F, the comparison operation circuit 4 and the leak current detection circuit 3. However, the invention is not limited to such a configuration. A power supply voltage of the semiconductor integrated circuit may be detected to control the source-substrate voltage or the source-drain voltage as soon as the power supply voltage reaches a predetermined voltage.

Figure 24:
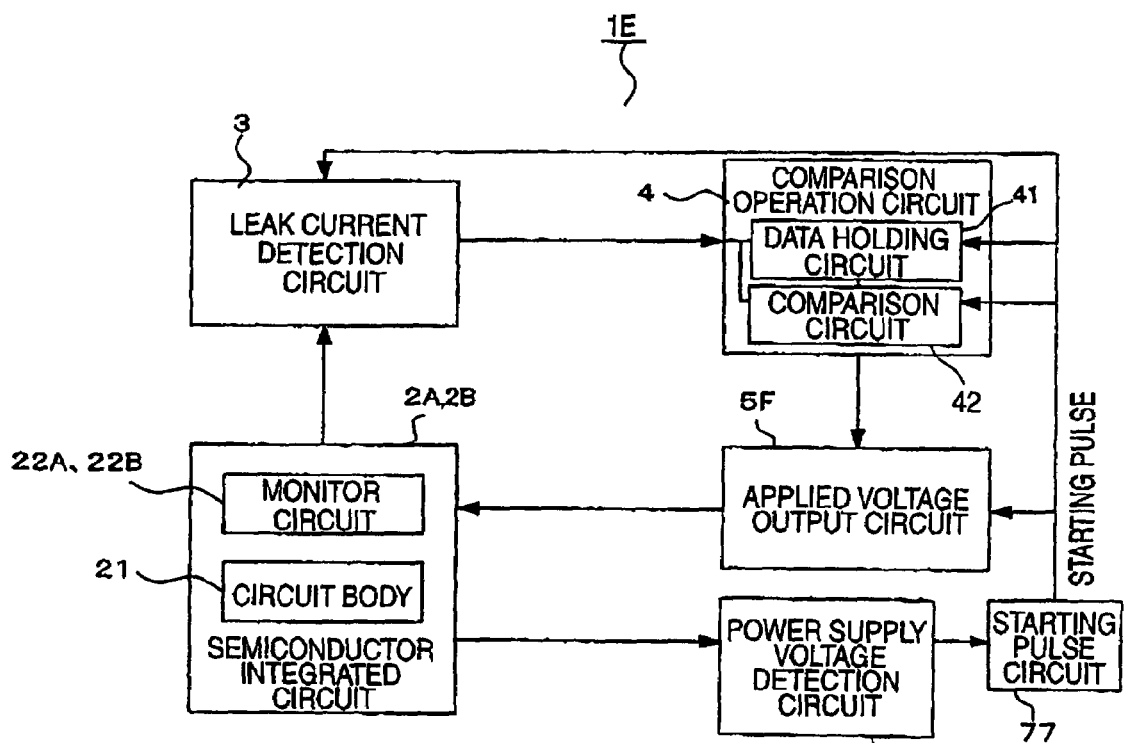
FIG. 24 is a block diagram of a semiconductor integrated circuit device having another configuration in place of FIG. 22.
Figure 25:
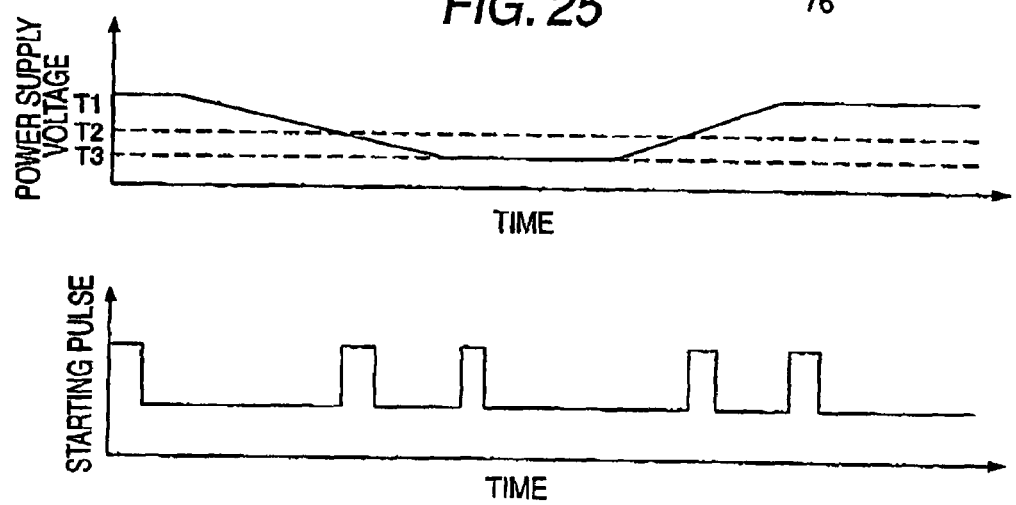
FIG. 25 is a chart showing the operation timing of the semiconductor integrated circuit device in FIG. 24.

FIG. 24 is a block diagram of a semiconductor integrated circuit device 1E configured thus. In the semiconductor integrated circuit device 1E, a power supply voltage detection circuit 76 is provided in place of the temperature detection circuit 75 shown in FIG. 22. FIG. 25 is a chart showing the operation timing of the semiconductor integrated circuit device 1E.

The operation in this case is similar to that in FIG. 22. That is, as soon as the power supply voltage reaches a predetermined voltage value, a trigger signal is outputted from the power supply voltage detection circuit 76 to the starting pulse circuit 77 so as to operate the applied voltage output circuit 5F, the comparison operation circuit 4 and the leak current detection circuit 3. Thus, the source/substrate voltage or the source-drain voltage is set and outputted by the applied voltage output circuit 5F.

The power supply voltage where the power supply voltage detection circuit 76 outputs a starting pulse does not have to be limited to one point, but it may be set at a plurality of voltage points. FIG. 25 shows the case where a starting pulse is outputted as soon as the power supply voltage reaches any one of three voltages V1, V2 and V3.

Thus, the applied voltage output circuit 5F, the comparison operation circuit 4 and the leak current detection circuit 3 operate intermittently so that the power consumption can be reduced.

Seventh Embodiment

Next, a seventh embodiment will be described. Constituent members the same as those in the first to sixth embodiments are referenced correspondingly, and description thereof will be omitted. This embodiment is adapted so that applied voltage data from the comparison operation circuit 4, data from the temperature detection circuit 75, data from the power supply voltage detection circuit 76, and product management information such as product specifications, a period of warrant, lower limit voltage information, etc. can be updated every predetermined time.

Figure 26:
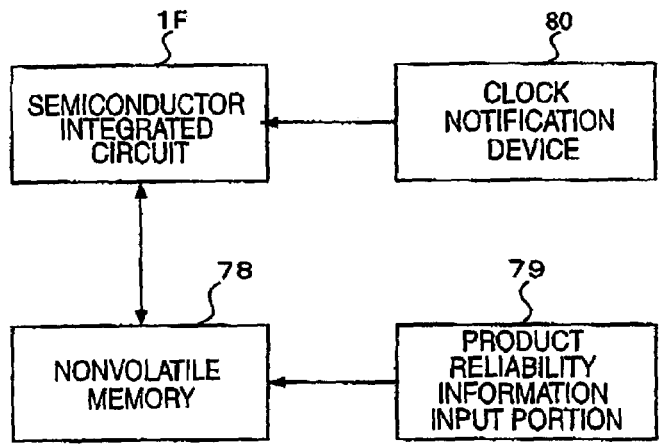
FIG. 26 is a block diagram of a semiconductor integrated circuit device applied to description of a seventh embodiment.

To this end, as shown in FIG. 26, a nonvolatile memory 78, a product reliability information input portion 79 and a clock notification device 80 are provided. Data from the comparison operation circuit 4, the temperature detection circuit 75 and the power supply voltage detection circuit 76, and the product management information such as product specifications, a period of warrant, lower limit voltage information, etc. are stored in the nonvolatile memory 78 in a format of a reference table. Predetermined product management information is stored in the nonvolatile memory 78 through the product reliability information input portion 79. On predetermined time, the clock notification device 80 notifies a semiconductor integrated circuit device 1F which is one of the semiconductor integrated circuit devices 1A to 1E, of the fact that the predetermined time has come.

The clock notification device 80 measures time of current conduction to the semiconductor integrated circuit device 1F. For example, the clock notification device 80 is activated once a year so as to output a trigger signal. When an initial test is performed on the semiconductor integrated circuit device 1F manufactured, information about how many years the semiconductor integrated circuit device 1F will be warranted, and a lower limit voltage of the source-substrate voltage are inputted into the nonvolatile memory 78 through the product reliability information input portion 79. After that, the semiconductor integrated circuit device 1F is operated once, and an operation test is performed thereon at a desired power supply voltage and a desired temperature. Applied voltage data obtained at that time are written into the nonvolatile memory 78 before shipment.

The clock notification device 80 starts up the semiconductor integrated circuit device 1F every year. The clock notification device 80 writes data from the temperature detection circuit 75 and the power supply voltage detection circuit 76 into the nonvolatile memory 78. For one year after that, the source-substrate voltage or the source-drain voltage set by one of the applied voltage output circuits 5A-5F based on the written data is outputted.

Thus, a frequent feedback loop operation in the semiconductor integrated circuit device 1F can be avoided to the utmost, so that the power consumption can be reduced. In addition, a maximum voltage of source-substrate voltages of MOSFETs can be defined in accordance with the number of years of warrant set for each product. Accordingly, for example, even if a leak current is beyond a lower limit voltage in a product warranted for ten years, the leak current can be suppressed in a product warranted for three years so that the power consumption can be reduced.

Eighth Embodiment

Next, an eighth embodiment will be described. Constituent members the same as those in the first to seventh embodiments are referenced correspondingly, and description thereof will be omitted. In this embodiment, the source-substrate voltage and the source-drain voltage are set in an optimum operation sequence.

Figure 27:
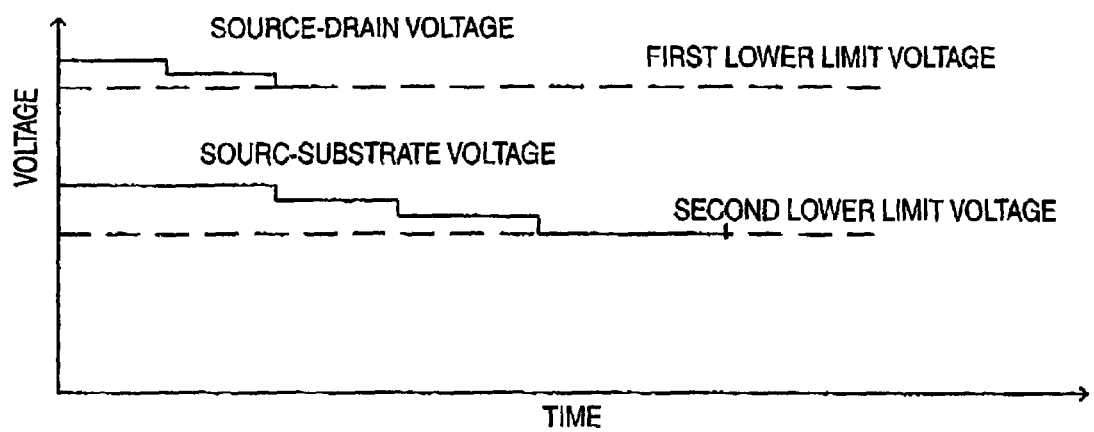
FIG. 27 is a diagram showing an operation sequence in a semiconductor integrated circuit device applied to description of an eighth embodiment.

FIG. 27 is a diagram showing the operation sequence. The abscissa designates time, and the ordinate designates the source-substrate voltage and the source-drain voltage to be supplied from an applied voltage output circuit to a semiconductor integrated circuit.

A first lower limit voltage is a lowest voltage with which the semiconductor integrated circuit can perform a desired operation, or a voltage necessary to hold data. A second lower limit voltage is a source-drain voltage for maintaining the reliability of the semiconductor, corresponding to the lower limit voltage described previously.

In the optimum operation sequence for the semiconductor integrated circuit device 1F, the source-rain voltage is first adjusted to be equal to the first lower limit voltage, and next the source-substrate voltage is adjusted to be equal to the second lower limit voltage. On the way of the successive operation performed thus, an optimum leak current may be found. In such a case, the source-drain voltage and the source-substrate voltage are set as they are at that time.

The reason why the source-drain voltage is adjusted in prior to the source-substrate voltage will be described with reference to FIGS. 28A and 28B. Assume that a drain leak current in FIG. 28A coincides with a drain leak current in FIG. 28B.

Figure 28:
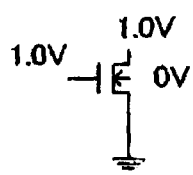
FIGS. 28A and 28B are diagrams for explaining the operation sequence.
Figure 28:
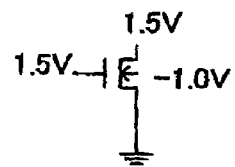

The source-drain voltage and the source-substrate voltage are "1" V and "0" V respectively in FIG. 28A. They are "1.5" V and "−1.0" V respectively in FIG. 28B. In such a case, when a voltage identical to the source-drain voltage is applied to each gate, the gate-substrate voltage reaches "1" V in FIG. 28A and "2.5" V in FIG. 28B.

A gate leak current exhibits a property of increasing/decreasing substantially exponentially with respect to the gate-substrate voltage, the gate-drain voltage and the source-drain voltage. Accordingly, the gate leak current in FIG. 28A is smaller. Thus, when the source-drain voltage which will have a larger voltage value is adjusted in priority, the influence of the gate leak current can be reduced.

The invention is useful to semiconductor integrated circuit devices for mobile applications using a battery or the like, semiconductor integrated circuit devices for use in cellular phones or IC cards using the semiconductor integrated circuit devices for mobile applications, and semiconductor integrated circuit devices for use in stationary electrical appliances etc.

What is claimed is:

1. A semiconductor integrated circuit device comprising a semiconductor integrated circuit including a MOS transistor having a substrate and a source,
   wherein a substrate supply voltage and a source supply voltage are separately provided to the MOS transistor,
   wherein the substrate is connected to two substrate supply voltage generating units, and the two substrate supply voltage generating units are switched by a control signal;
   wherein:
   at least one of the substrate voltage supply generating units comprises a monitor element including a monitor MOS transistor, a current source, a comparator, and an amplifier configured to receive an output from the comparator and output the substrate supply voltage applied to said MOS transistor in the semiconductor integrated circuit,
   a drain of the monitor MOS transistor of the monitor element is connected to the current source;
   the comparator is configured to compare a drain voltage of the monitor MOS transistor with a signal indicative of a leak current of the MOS transistor in the semiconductor integrated circuit;
   a substrate voltage of the amplifier is adjusted such that a drain voltage of the MOS transistor in the semiconductor integrated circuit is equal to the substrate supply voltage supplied to the semiconductor integrated circuit; and
   a gate voltage of the monitor MOS transistor of the monitor element is controlled by the control signal.

2. The semiconductor integrated circuit device according to claim 1, wherein a current value of the current source is controlled by the control signal.

3. The semiconductor integrated circuit device according to claim 1, wherein the source is connected to two source supply voltage generating units and the two source supply voltage generating units is switched by the control signal.

4. The semiconductor integrated circuit device according to claim 3, wherein:
   at least one of the source voltage supply generating units comprises a monitor element including a monitor MOS transistor; a current source; a comparator; and an amplifier configured to receive an output from the comparator and output the source supply voltage applied to said MOS transistor in the semiconductor integrated circuit,
   a drain of the monitor MOS transistor of the monitor element is connected to the current source;
   the comparator is configured to compare a drain voltage of the monitor MOS transistor with a signal indicative of a leak current of the MOS transistor in the semiconductor integrated circuit;
   a substrate voltage of the amplifier is adjusted such that a drain voltage of the MOS transistor in the semiconductor integrated circuit is equal to the source supply voltage supplied to the semiconductor integrated circuit; and
   a gate voltage of the monitor MOS transistor of the monitor element is controlled by the control signal.

5. The semiconductor integrated circuit device according to claim 4, wherein a current value of the current source is controlled by the control signal.

* * * * *